(12) United States Patent
Yoshida et al.

(10) Patent No.: US 10,264,630 B2
(45) Date of Patent: Apr. 16, 2019

(54) PLASMA PROCESSING APPARATUS AND METHOD FOR PROCESSING OBJECT

(71) Applicant: TOKYO ELECTRON LIMITED, Tokyo (JP)

(72) Inventors: Ryoichi Yoshida, Miyagi (JP); Hiraku Murakami, Miyagi (JP); Nobutaka Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 814 days.

(21) Appl. No.: 14/630,775

(22) Filed: Feb. 25, 2015

(65) Prior Publication Data
US 2015/0245460 A1 Aug. 27, 2015

(30) Foreign Application Priority Data
Feb. 27, 2014 (JP) .................... 2014-036616

(51) Int. Cl.
| H05B 1/00 | (2006.01) |
| H05B 7/18 | (2006.01) |
| H01J 37/32 | (2006.01) |

(52) U.S. Cl.
CPC .......... *H05B 7/18* (2013.01); *H01J 37/32091* (2013.01); *H01J 37/32568* (2013.01); *H01J 37/32623* (2013.01)

(58) Field of Classification Search
CPC .... H05B 7/18; H05B 7/48; H01J 37/32; H01J 37/32018; H01J 37/32082; H01J 37/32091; H01J 37/32165; H01J 37/32174; H01J 37/3244; H01J 37/32348; H01J 37/32422; H01J 37/32522; H01J 37/32532; H01J 37/32568; H01J 37/32577; H01J 37/32623; H01J 37/32642; H01J 37/32697; H01J 37/32706; H01J 37/32834
USPC ........ 373/18, 22; 219/121.35, 121.4, 121.41, 219/121.43; 156/345.1, 345.51, 345.52, 156/345.24, 345.28, 345.33, 345.34, (Continued)

(56) References Cited

U.S. PATENT DOCUMENTS

| 2006/0037701 A1* | 2/2006 | Koshiishi .......... H01J 37/32082 156/345.44 |
| 2009/0200269 A1* | 8/2009 | Kadkhodayan ....... C23C 14/564 156/345.47 |
| 2012/0061351 A1* | 3/2012 | Ohata ............... H01J 37/32091 216/67 |

FOREIGN PATENT DOCUMENTS

JP 2004-511906 A 4/2004

\* cited by examiner

*Primary Examiner* — Hung D Nguyen
(74) *Attorney, Agent, or Firm* — Rothwell, Figg, Ernst & Manbeck, P.C.

(57) ABSTRACT

A plasma processing apparatus includes a processing chamber including a sidewall; a mounting table including a lower electrode and provided in the processing chamber; an upper electrode arranged to face the lower electrode in a first direction; a high frequency power supply configured to apply a high frequency power for plasma generation to the upper electrode; a gas supply system for supplying a processing gas into the processing chamber; and a grounding unit connected to a ground potential. A first space is defined between the mounting table and the sidewall. A second space is defined between the upper electrode and the lower electrode. The grounding unit is configured to move independently from the upper electrode in the first direction in a third space which extends to the first space in the first (Continued)

direction and also to the second space in a second direction perpendicular to the first direction.

8 Claims, 5 Drawing Sheets

(58) Field of Classification Search
USPC ............ 156/345.38, 345.44, 345.47, 345.48,
156/345.54, 345.37, 345.27, 345.15
See application file for complete search history.

PLASMA PROCESSING APPARATUS AND METHOD FOR PROCESSING OBJECT

CROSS-REFERENCE TO RELATED APPLICATIONS

This application claims priority to Japanese Patent Application No. 2014-036616 filed on Feb. 27, 2014, the entire contents of which are incorporated herein by reference.

FIELD OF THE INVENTION

The present invention relates to a plasma processing apparatus and a method for processing an object.

BACKGROUND OF THE INVENTION

There is known a plasma processing apparatus for processing an object by using a plasma of a processing gas. For example, Japanese Patent Application Publication No. 2004-511906 discloses a capacitively coupled plasma processing apparatus including a processing chamber, a mounting table and an upper electrode. The mounting table is provided at a lower portion of the processing chamber. The mounting table mounts thereon an object to be processed and serves as a lower electrode. Further, the mounting table includes an edge ring surrounding an outer periphery of an electrostatic chuck for attracting and holding the object. The upper electrode has a central portion and a peripheral portion. The upper electrode is provided at an upper portion of the processing chamber.

In the apparatus disclosed in Japanese Patent Application Publication No. 2004-511906, the upper electrode has a stepped portion having a trapezoidal cross section and protruding downward from a surface of the upper electrode which faces a processing space. The stepped portion is formed at a peripheral portion of the upper electrode so as to face the edge ring of the lower electrode. Since the apparatus disclosed in Japanese Patent Application Publication No. 2004-511906 has such a stepped portion, a plasma density in a region near the peripheral portion of the upper electrode is locally increased, thereby increasing the etching speed at a peripheral region of the object.

When a semiconductor device is manufactured, it is required to reduce dimensional variation of a shape formed at the entire area of the object. In the apparatus disclosed in Japanese Patent Application Publication No. 2004-511906, the etching speed near the peripheral portion of the upper electrode can be controlled by the stepped portion formed at the upper electrode. However, an etching speed at an outermost peripheral region of the object may not be sufficiently increased depending on processing gases. In that case, a shape formed at the central region of the object may be different from a shape formed at the outermost peripheral region of the object. The present inventors have studied on the above problem and found that a plasma density in a space above an outside of the outer periphery of the mounting table needs to be controlled in order to control the dimension of the shape at the outermost peripheral region of the object.

SUMMARY OF THE INVENTION

In view of the above, the present invention provides a plasma processing apparatus and an object processing method, which are capable of controlling a plasma density in a space above an outside of an outer periphery of a mounting table.

In accordance with an aspect of the present invention, there is provided a plasma processing apparatus including: a processing chamber including a sidewall; a mounting table including a lower electrode, the mounting table provided in the processing chamber such that a first space is defined between the mounting table and the sidewall; an upper electrode arranged to face the lower electrode in a first direction such that a second space is defined between the upper electrode and the lower electrode; a high frequency power supply configured to apply a high frequency power for plasma generation to the upper electrode; a gas supply system for supplying a processing gas into the processing chamber; and a grounding unit connected to a ground potential, the grounding unit being configured to move independently from the upper electrode in the first direction in a third space which extends to the first space in the first direction and also to the second space in a second direction perpendicular to the first direction.

In accordance with another aspect of the present invention, there is provided a method for processing an object by using the plasma processing apparatus, the method including: mounting the object on the mounting table; moving the grounding unit independently from the upper electrode along the first direction in the third space; and supplying a processing gas into the processing chamber and generating plasma of the processing gas in the processing chamber.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings. Further, like reference numerals will be used for like or corresponding parts in the respective drawings.

Figure 1:
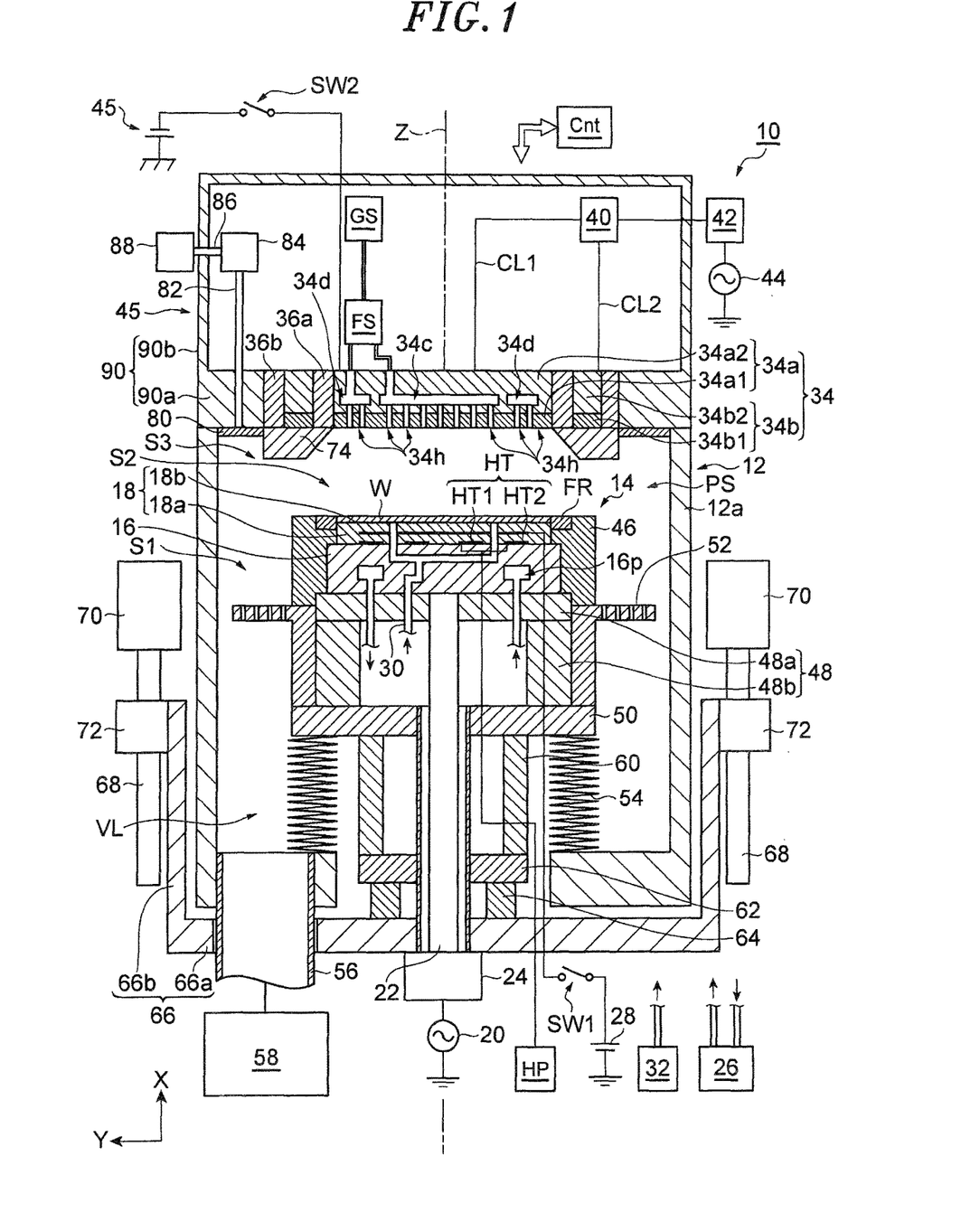
FIG. 1 schematically shows a plasma processing apparatus in accordance with an embodiment of the present invention.

First, a plasma processing apparatus in accordance with an embodiment of the present invention will be described. FIG. 1 is a schematic cross sectional view of the plasma processing apparatus in accordance with the embodiment of the present invention. A plasma processing apparatus 10 shown in FIG. 1 is a parallel plate type plasma processing apparatus.

The plasma processing apparatus 10 includes a processing chamber 12. The processing chamber 12 has a processing space PS therein. The processing chamber 12 includes a substantially cylindrical sidewall 12a extending in a vertical direction along a Z-axis. Formed at the sidewall 12a is a gate valve for opening and closing a loading/unloading port for an object (substrate). Hereinafter, for convenience of explanation, an extended direction of the Z-axis will be referred to as a X direction which is a first direction and a direction perpendicular to the X direction will be referred to as a Y direction which is a second direction.

A mounting table 14 is provided in the processing chamber 12. The mounting table 14 includes a base 16, an electrostatic chuck 18, a cylindrical surrounding portion 46, and a focus ring FR. The base 16 is formed in a substantially disc shape and has a conductive property. The base 16 serves as a lower electrode and may be made of, e.g., aluminum.

A high frequency power supply 20 is connected to the base 16 through a power feed rod 22 and a matching unit 24. The high frequency power supply 20 applies a high frequency power (i.e., a high frequency bias power) having a predetermined high frequency for ion attraction (e.g., about 2 MHz to 27 MHz) to the lower electrode, i.e., the base 16.

The electrostatic chuck 18 is provided on a top surface of the base 16. The electrostatic chuck 18 is a substantially disc-shaped member and includes an insulating layer 18a and a power feeding layer 18b. The insulating layer 18a is a film made of an insulating material such as ceramic or the like. The power feeding layer 18b is a conductive film embedded in the insulating layer 18a. The power feeding layer 18b is connected to a DC power supply 28 via a switch SW1. When a DC voltage is applied from the DC power supply 28 to the power feeding layer 18b, a Coulomb force is generated and the object W is attracted and held on the electrostatic chuck 18 by the Coulomb force.

The cylindrical surrounding part 46 is configured to surround the base 16. An outer surface of the cylindrical surrounding part 46 faces the sidewall 12a through a first space S1 in the Y direction. The first space S1 is formed at the outside of the mounting table 14 and defined by the outer surface of the cylindrical surrounding part 46 and the sidewall 12a. A focus ring FR is provided on a top surface of the cylindrical surrounding part 46 so as to surround the electrostatic chuck 18.

In the present embodiment, the base 16 may have a function of cooling the electrostatic chuck 18 by absorbing the heat of the electrostatic chuck 18. Specifically, a coolant path 16p is formed in the base 16. The coolant path 16p is connected to a coolant inlet line and a coolant outlet line. The coolant inlet line and the coolant outlet line are connected to a chiller unit 26. A coolant is circulated such that it is supplied from the chiller unit 26 to the coolant path 16p through the coolant inlet line and returns from the coolant path 16p to the chiller unit 26 through the coolant outlet line. The mounting table 14 is configured such that temperatures of the base 16 and the electrostatic chuck 18 can be controlled to predetermined levels by circulating a proper coolant, e.g., cooling water, through the coolant path 16p.

In the present embodiment, a heater HT as a heating element may be provided between the electrostatic chuck 18 and the base 16. In the example shown in FIG. 1, the heater HT includes heaters HT1 and HT2. The heaters HT1 and HT2 are connected to a heater power supply HP. The heater HT1 extends in an annular shape so as to surround the Z-axis and heats a central region including the center of the electrostatic chuck 18, so that a central region including the center of the object W is heated. The heater HT2 extends in an annular shape so as to surround the Z-axis at the outside of the heater HT1. The heater HT2 heats an outer region from the central region of the electrostatic chuck 18, i.e., an edge region including the edge of the electrostatic chuck 18, so that an edge region including the edge of the object W is heated. The heater HT can control a temperature of the object W for each of a plurality of regions divided radially from the center of the object W.

The plasma processing apparatus 10 may further include a gas supply line 30 and a heat transfer gas supply unit 32. The heat transfer gas supply unit 32 is connected to the gas supply line 30. The gas supply line 30 extends to the top surface of the electrostatic chuck 18 and extends in an annular shape on the top surface. The heat transfer gas supply unit 32 supplies a heat transfer gas, e.g., He gas, to a gap between the top surface of the electrostatic chuck 18 and the object W.

The plasma processing apparatus 10 further includes an upper electrode 34. The upper electrode 34 is disposed above the lower electrode, i.e., the base 16, and faces the lower electrode in the X direction. A second space S2 is formed between the upper electrode 34 and the lower electrode. In other words, the second space S2 is disposed above the mounting table 14 inside the processing chamber 12. In the present embodiment, as shown in FIG. 1, the upper electrode 34 may be configured to cover an upper opening of the processing chamber 12.

In the present embodiment, the upper electrode 34 includes an inner electrode part 34a and an outer electrode part 34b. The inner electrode part 34a has an electrode plate 34a1 and an electrode holder 34a2. The electrode plate 34a1 is a conductive member. In the present embodiment, the electrode plate 34a1 is made of silicon. The electrode plate 34a1 has a substantially disc shape and is disposed such that a central axis thereof coincides with the Z-axis. The electrode holder 34a2 has a conductive property and is made of, e.g., aluminum. The electrode holder 34a2 holds the electrode plate 34a1.

The outer electrode part 34b has an electrode plate 34b1 and an electrode holder 34b2. The electrode plate 34b1 is a conductive member. In the present embodiment, the electrode plate 34b1 is made of silicon. The electrode plate 34b1 extends in an annular shape about the Z-axis at the outside of the electrode plate 34a1. The electrode holder 34b2 has a conductive property and is made of, e.g., aluminum. The electrode holder 34b2 extends in an annular shape about the Z-axis at the outside of the electrode holder 34a2 and holds the electrode plate 34b1. An insulating member 36a is disposed between the outer electrode part 34b and the inner electrode part 34a. Another insulating member 36b is disposed between the outer electrode part 34b and the upper portion of the processing chamber 12.

In the present embodiment, the inner electrode part 34a may be connected to a power control circuit 40 through a wiring CL1. The outer electrode part 34b may be connected to the power control circuit 40 through a wiring CL2. A high frequency power supply 44 is connected to the power control circuit 40 via a matching unit 42. The high frequency power supply 44 supplies to the upper electrode 34 a high frequency power having a predetermined high frequency (e.g., 27 MHz or above) for plasma generation.

Figure 2:
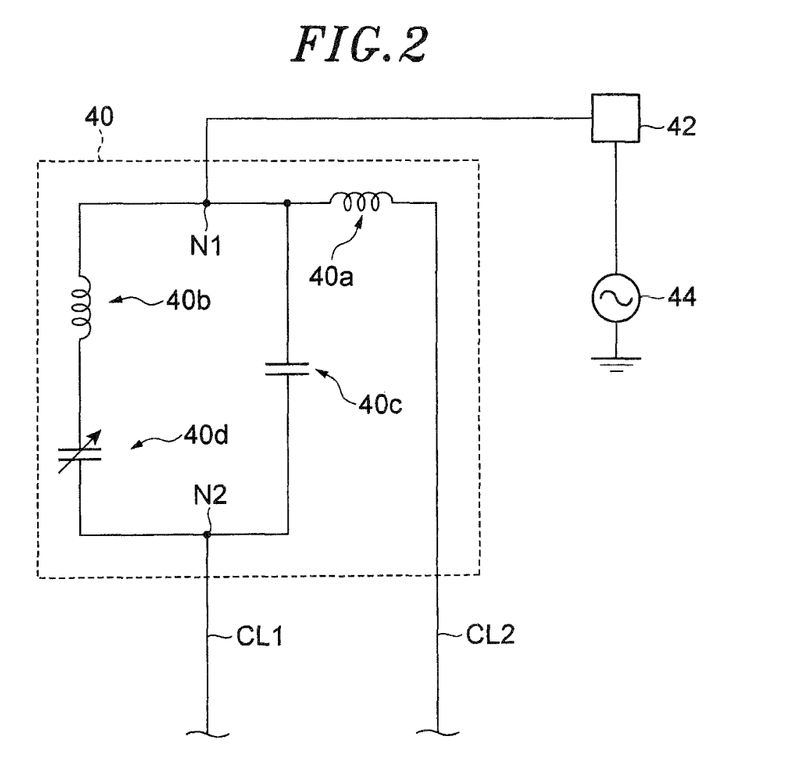
FIG. 2 shows an example of a power control circuit 40 shown in FIG. 1.

FIG. 2 shows an example of the power control circuit 40 shown in FIG. 1. As shown in FIG. 2, the power control circuit 40 includes inductors 40a and 40b and capacitors 40c and 40d. A wiring extending from the matching unit 42 to the power control circuit 40 is connected to a node N1 of the power control circuit 40. One end of the inductor 40a is connected to the node N1 and the other end of the inductor 40a is connected to the wiring CL2. Further, one end of the capacitor 40c is connected to the node N1 in parallel with the inductor 40a. One end of a series circuit of the inductor 40b and the variable capacitor 40d is further connected to the node N1. The other end of the capacitor 40c and the other end of the series circuit of the inductor 40b and the variable capacitor 40d are connected to a node N2. The wiring CL1 is connected to the node N2.

In the power control circuit 40, the high frequency power supplied from the high frequency power supply 44 to the inner electrode part 34a and the high frequency power supplied from the high frequency power supply 44 to the outer electrode part 34b can be controlled by controlling the capacitance of the variable capacitor 40d. Accordingly, it is possible to relatively control a plasma density below the inner electrode part 34a and a plasma density below the outer electrode part 34b. As a result, a processing speed at a central region of the object W and a processing speed at an edge region of the object W can be relatively controlled.

Referring back to FIG. 1, in the present embodiment, a DC power supply 45 is connected to the inner electrode part 34a via a switch SW2. The DC power supply 45 applies a negative DC voltage to the inner electrode part 34a when the switch SW2 is closed.

In the plasma processing apparatus 10, the upper electrode 34 serves as a shower head. In the present embodiment, a first buffer space 34c and a second buffer space 34d are formed in the electrode holder 34a2 of the inner electrode part 34a. The first buffer space 34c is provided at the central portion of the electrode holder 34a2. The second buffer space 34d extends in an annular shape so as to surround the first buffer space 34c. The second buffer space 34d is separated from the first buffer space 34c. The first buffer space 34c and the second buffer space 34d are connected to a gas supply unit GS via a flow splitter FS. A plurality of gas injection holes 34h extends downward from the first buffer space 34c and the second buffer space 34d through the electrode holder 34a2 and the electrode plate 34a1 to communicate with the processing space PS.

The gas supply unit GS includes a gas source, a valve, and a mass flow controller. The gas supply unit GS supplies a processing gas such as an etching gas stored in the gas source to the flow splitter FS. In the plasma processing apparatus 10, the gas supply unit GS, the flow splitter FS, the first and the second buffer space 34c and 34d, and the gas injection holes 34h constitute a gas supply system. In the gas supply system, a gas is supplied from the gas source to the flow splitter FS at a flow rate controlled by a mass flow controller. The gas supplied to the flow splitter FS is supplied to the first buffer space and the second buffer space 34c and 34d at a controlled distribution ratio by the flow splitter FS and injected into the processing space PS through the gas injection holes 34h. The gas injection holes 34h connected to the first buffer space 34c are disposed to face the central region of the object W. The gas injection holes 34h connected to the second buffer space 34d are disposed to face the edge region of the object W. Therefore, in the plasma processing apparatus 10, it is possible to separately control a flow rate of a gas supplied to a space above the central region of the object W and a flow rate of a gas supplied to a space above the edge region of the object W. Accordingly, a processing speed at the central region of the object W and a processing speed at the edge region of the object W can be separately controlled.

The plasma processing apparatus 10 may further include a ground conductor 90. In the present embodiment, the ground conductor 90 may include an annular portion 90a and a cylindrical portion 90b. The annular portion 90a is a ground conductor having an annular shape about the Z-axis and extends in the Y direction from the upper end of the sidewall 12a toward the Z-axis. The inner end surface of the annular portion 90a in the Y direction is in contact with the insulating member 36b. The cylindrical portion 90b is a substantially cylindrical ground conductor and extends from an upper portion of the sidewall 12a of the processing chamber 12 to a position higher than the upper electrode 34.

In the present embodiment, a protruding portion 74 is formed below the upper electrode 34. The protruding portion 74 faces the focus ring FR of the mounting table 14. The protruding portion 74 has a trapezoidal vertical cross section and extends in an annular shape about the Z-axis below the insulating member 36b. The protruding portion 74 is made of, e.g., quartz, and can control a density of a plasma generated above the peripheral portion of the mounting table 14. The protruding portion 74 may have a thickness of 0 mm to 20 mm in the X direction.

The plasma processing apparatus 10 further includes a grounding unit 80 between the protruding portion 74 and the sidewall 12a. The grounding unit 80 is configured to be movable independently along the X direction inside a third space S3 formed above the outside of the outer periphery of the mounting table 14. The third space S3 continues to the first space S1 in the X direction and also continues to the second space S2 in the Y direction. The grounding unit 80 defines the third space S3 from above. The grounding unit 80 is made of a conductive material such as yttrium oxide, aluminum oxide and aluminum nitride and may be a plate-shaped member extending in an annular shape about the Z-axis. The grounding unit 80 is electrically connected to, e.g., the ground conductor 90 having a ground potential.

In the present embodiment, one end of a holding shaft 82 is connected to a main surface of the grounding unit 80. The holding shaft 82 extends in a direction perpendicular to the main surface of the grounding unit 80, i.e., in the X direction. The other end of the holding shaft 82 is connected to a direction converter 84. The direction converter 84 is connected to a driving unit 88 through a driving shaft 86. The driving unit 88 includes a motor and thus can reciprocally move the driving shaft 86 in the Y direction that is an axial direction of the driving shaft 86 by using a driving force of the motor. The direction converter 84 includes a driving direction conversion mechanism such as a cam mechanism and converts movement in the axial direction of the driving shaft 86 to movement in the axial direction of the holding shaft 82. The grounding unit 80 is held by the holding shaft 82 so as to be movable in a vertical direction in the third space S3 by the driving force transmitted from the driving unit 88 to the grounding unit 80. The grounding unit 80, the holding shaft 82, the direction converter 84, the driving shaft 86, and the driving unit 88 constitute a first driving mechanism.

Figure 3:
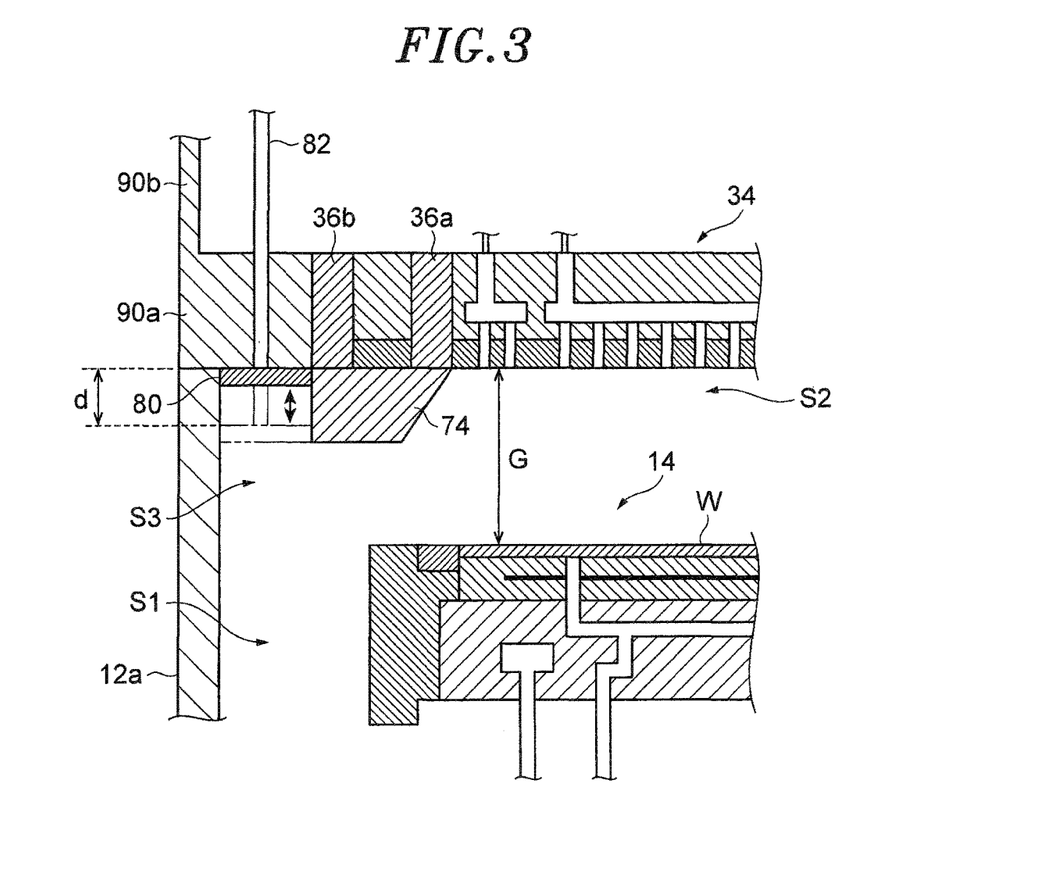
FIG. 3 shows an example of movement of a grounding unit.

FIG. 3 shows an example of movement of the grounding unit 80. As shown in FIG. 3, due to the reciprocal movement of the holding shaft 82 along the X direction by the driving force from the driving unit 88, the grounding unit 80 moves in a direction that becomes close to the annular portion 90a of the ground conductor 90 or in a direction away from the annular portion 90a, in the space between the protruding portion 74 and the sidewall 12a. As a result, the grounding unit 80 can be moved along the X direction, i.e., along the vertical direction, by the first driving mechanism.

Since the third space S3 is defined from above by the grounding unit 80, when the grounding unit 80 is moved in a direction toward the annular portion 90a, i.e., in an upward direction, the volume of the third space S3 is increased by the moving amount of the grounding unit 80. On the other hand, when the grounding unit 80 is moved in a direction away from the annular portion 90a, i.e., in a downward direction, the volume of the third space S3 is reduced by the moving amount of the grounding unit 80. As such, the first driving mechanism can increase or reduce the volume of the third space S3. The density of the plasma generated in the third space S3 depends on the volume of the third space S3. Therefore, the first driving mechanism can control the density of the plasma generated in the third space S3, i.e., in the space above the outside of the outer periphery of the mounting table 14. In the present embodiment, when a vertical distance between a reference position corresponding to a position of a surface of the upper electrode 34 which contacts with the second space S2 in the X direction and the top surface of the grounding unit 80 in the X direction, i.e., a vertical distance between the bottom surface of the annular portion 90a and the top surface of the grounding unit 80, is set to "d", the grounding unit 80 may be held by the holding shaft 82 such that the distance d can be changed within a range from 0 to 20 mm.

The plasma processing apparatus 10 includes a second driving mechanism capable of adjusting a distance (gap) G between the upper electrode 34 and the mounting table 14 having the lower electrode. In the embodiment shown in FIG. 1, the plasma processing apparatus 10 includes a second driving mechanism capable of moving the mounting table 14 in the X direction, i.e., in the vertical direction.

The cylindrical surrounding part 46 and the base 16 are supported by a supporting table 48. The supporting table 48 includes a plate portion 48a and a cylindrical leg portion 48b. The plate portion 48a of the supporting table 48 is in contact with a lower end of the cylindrical surrounding part 46 and a bottom surface of the base 16. The cylindrical surrounding part 46 and the base 16 are fixed to the plate portion 48a. The leg portion 48b extends downward from a bottom surface of the plate portion 48a. The supporting table 48 is provided on a supporting plate 50 such that the lower end of the leg portion 48b is brought into contact with a top surface of the supporting plate 50. The supporting table 48 is fixed to the supporting plate 50.

A baffle plate 52 is provided between the supporting plate 50 and the cylindrical surrounding part 46. The baffle plate 52 extends in an annular shape between the supporting table 48 and the sidewall 12a of the processing chamber 12. The baffle plate 52 has a plurality of through holes. Further, a cylindrical bellows 54 is provided between an outer peripheral portion of the bottom surface of the supporting plate 50 and a lower portion of the processing chamber 12. The bellows 54 defines, together with the sidewall 12a of the processing chamber 12, a gas exhaust passageway VL communicating with the processing space PS through the baffle plate 52 and isolates the inner space of the processing chamber 12 such as the gas exhaust passageway VL and the processing space PS from the outside of the processing chamber 12. A gas exhaust line 56 communicating with the gas exhaust passageway VL is provided at the lower portion of the processing chamber 12. A gas exhaust unit 58 is connected to the gas exhaust line 56.

A leg portion 60, an annular plate 62, and a leg portion 64 are provided in a space surrounded by the bellows 54. An upper end of the leg portion 60 is coupled to the bottom surface of the supporting plate 50. A lower end of the leg portion 60 is coupled to a top surface of the annular plate 62. An upper end of the leg portion 64 is coupled to a bottom surface of the annular plate 62. A lower end of the leg portion 64 is coupled to a plate portion 66a of a link 66.

As shown in FIG. 1, the link 66 includes the plate portion 66a and two columnar portions 66b. The plate portion 66a is provided below the bottom portion of the processing chamber 12. In the present embodiment, the aforementioned matching unit 24 is installed at the plate portion 66a. A through-hole extending in the X direction is formed through the centers of the plate portion 66a, the supporting plate 50, and the plate portion 48a of the supporting table 48. The aforementioned power feed rod 22 extends to the base 16 through the through-hole of the plate portion 66a, an inner hole of the annular plate 62, the through hole of the supporting plate 50, and the through hole of the plate portion 48a of the supporting table 48.

The columnar portions 66b extend upward from the peripheral edge of the plate portion 66a. The columnar portions 66b extend substantially in parallel to the sidewall 12a at the outside of the sidewall 12a. A feeding mechanism using a ball screw is connected to each of the columnar portions 66b. Specifically, two screw axes 68 extend substantially in parallel to the two columnar portions 66b at the outside of the sidewall 12a. The screw axes 68 are connected to two motors 70, respectively. Two nuts 72 are attached to the screw axes 68, respectively. The two columnar portions 66b are coupled to the nuts 72, respectively.

The second driving mechanism can move the nuts 72 in the X direction, i.e., in the vertical direction, by rotating the motors 70. Due to the vertical movement of the nuts 72, the mounting table 14 indirectly supported by the link 66 can be moved in the X direction, i.e., in the vertical direction. The bellows 54 is extended/contracted by the vertical movement of the mounting table 14. As a result, the distance between the base 16, i.e., the lower electrode, and the upper electrode 34 can be controlled while ensuring airtightness in the processing space PS. In the present embodiment, the second driving mechanism may adjust the distance G between the mounting table 14 and the upper electrode 34 within a range of 20 mm to 150 mm.

In the present embodiment, the plasma processing apparatus 10 further includes a control unit Cnt. The control unit Cnt may be, e.g., a programmable computer. The control unit Cnt is connected to the switch SW1, the high frequency power supply 20, the matching unit 24, the high frequency power supply 44, the matching unit 42, the variable capacitor 40d, the switch SW2, the gas supply unit GS, the flow splitter FS, the heat transfer gas supply unit 32, the chiller unit 26, the heater power supply HP, the gas exhaust unit 58, the motors 70, and the driving unit 88.

The control unit Cnt operates in accordance with a program based on an input recipe and transmits control signals. Based on the control signals from the control unit Cnt, it is possible to control opening/closing of the switch SW1, power supply from the high frequency power supply 20, an impedance of the matching unit 24, power supply from the high frequency power supply 44, an impedance of the matching unit 42, a capacitance of the variable capacitor 40d, opening/closing of the switch SW1, selection of a gas among gases supplied from the gas supply unit GS and a flow rate thereof, a distribution ratio of the flow splitter FS, gas supply from the heat transfer gas supply unit 32, a flow rate and a temperature of a coolant from the chiller unit 26, power supply from the heater power supply HP, evacuation using the gas exhaust unit 58, driving of the motors 70, and driving of the driving unit 88.

Figure 4:
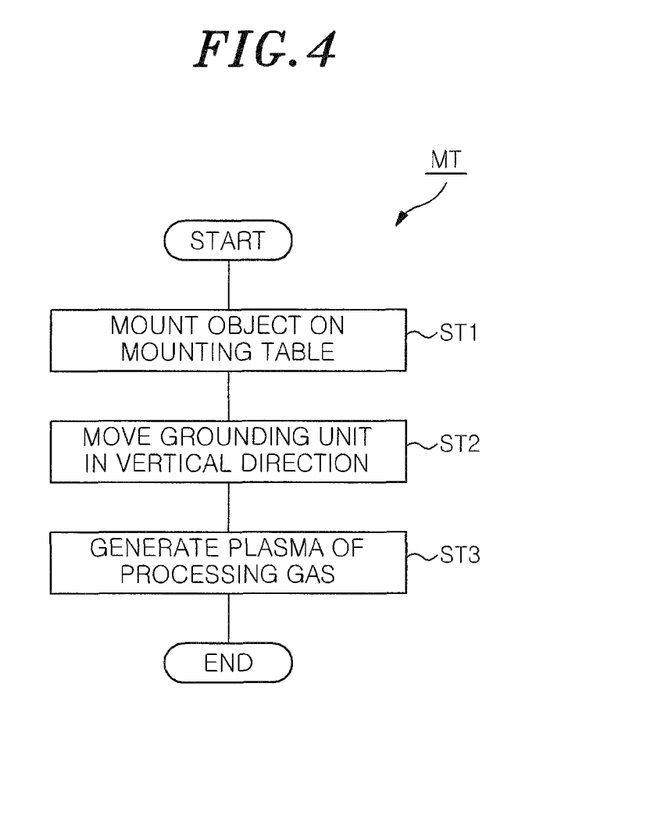
FIG. 4 shows a method for processing an object in accordance with the embodiment of the present invention.

Next, a method for processing an object W in accordance with the present embodiment will be described. FIG. 4 is a flowchart showing a method MT1 of processing an object W in accordance with the present embodiment. In the method MT1, first, in a step ST1, an object W is mounted on the electrostatic chuck 18 of the mounting table 14. Next, in a step ST2, the control unit Cnt moves the grounding unit 80 in the X direction, i.e., in the vertical direction. The moving amount of the grounding unit 80 can be determined by the processing conditions for the object W such as combination of processing gases or flow rates thereof. By executing the step ST2, the density of the plasma generated in the third space S3, i.e., in the space above the outside of the outer periphery of the mounting table 14, which will be later described in a step ST3, is controlled. In the step ST2, the motors 70 are driven by the control signal from the control unit Cnt and the height of the mounting table 14 may be controlled such that the distance G between the upper electrode 34 and the mounting table 14 becomes a desired distance ranging from, e.g., 20 mm to 150 mm. Next, in the step ST3, the control unit Cnt controls the gas supply unit GS to supply the processing gas into the processing chamber 12, so that a plasma of the processing gas is generated in the processing chamber 12.

As described above, the plasma processing apparatus 10 shown in FIG. 1 can control the plasma density in the space above the outside of the outer periphery of the mounting table 14 which contributes to an etching rate of an outermost peripheral region of the object W by moving the grounding unit 80 in the X direction in the third space S3. Further, the plasma processing apparatus 10 can control the plasma density by moving the grounding unit 80 within a relatively small range. Therefore, it is possible to suppress plasma leakage in the processing space PS caused by a weak grounding. In the plasma processing apparatus 10, the grounding unit 80 is deviated from a position directly above the object W, so that dust generated by the driving of the grounding unit 80 is prevented from being adhered to the object W.

Although the embodiments of the present invention have been described, the present invention may be variously modified without being limited to the above-described embodiments. For example, the plasma processing apparatus of the above embodiment employs as the second driving mechanism the configuration in which the mounting table 14 having the lower electrode is movable in the X direction. However, it is not necessary to provide the second driving mechanism. Further, a configuration in which the upper electrode 34 is movable in the X direction may be employed as the second driving mechanism.

Although the plasma processing apparatus of the above embodiment includes the protruding portion 74, the protruding portion 74 may not be provided. For example, when the width of the grounding unit 80 in the Y direction is sufficient to define the third space S3 from above, the plasma density in the third space S3 can be controlled by controlling the volume of the third space S3 even if the first driving mechanism of the plasma processing apparatus 10 does not include the protruding portion 74.

Hereinafter, test examples using the plasma processing apparatus 10 will be described.

Test Examples 1 and 2

In a test example 1, a distance d between the bottom surface of the upper electrode 34 and the top surface of the grounding unit 80 is set to 0 mm and, then, the plasma density in the processing space PS was measured. In a test example 2, the distance d between the bottom surface of the upper electrode 34 and the top surface of the grounding unit 80 was set to 20 mm and, then, the plasma density in the processing space PS was measured. As for the object W, a substrate having a radius of 150 mm was used. As for the mounting table 14, one having a radius of 210 mm which corresponds to a distance from a center thereof to the outer circumferential surface of the cylindrical surrounding part 46 was used. The grounding unit 80 was separated from the center of the object W by a distance of 200 mm to 300 mm when seen from the X direction. The other conditions of the test examples 1 and 2 were the same.

Figure 5:
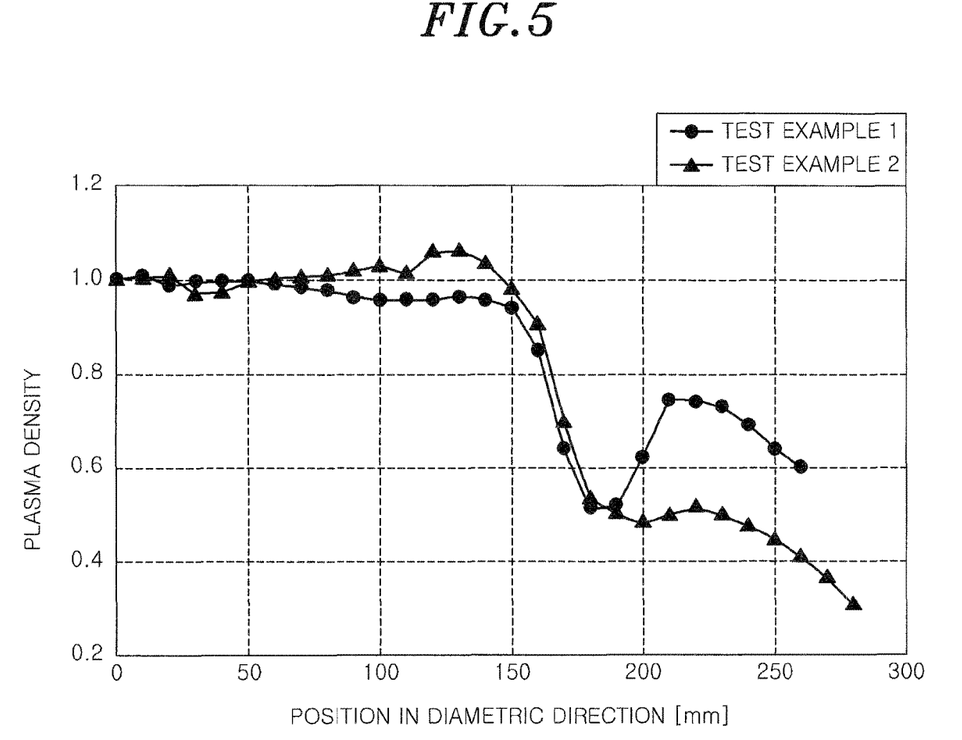
FIG. 5 shows results of test examples 1 and 2.

The results of the test examples 1 and 2 are shown in FIG. 5. In FIG. 5, the horizontal axis represents a distance in the Y direction from the center of the object W and the vertical axis represents a relative plasma density in the case of setting a plasma density directly above the center of the object W to 1. As shown in FIG. 5, in the test example 1, the plasma density at the outside of the mounting table 14 (at a position separated by 200 mm to 250 mm from the center of the mounting table 14) was improved compared to the test example 2. From the result, it is clear that the plasma density in the space above the outside of the outer periphery of the mounting table 14 can be controlled by moving the grounding unit 80 in that space.

While the invention has been shown and described with respect to the embodiments, it will be understood by those skilled in the art that various changes and modifications may be made without departing from the scope of the invention as defined in the following claims.

What is claimed is:

1. A plasma processing apparatus comprising:
a processing chamber including a sidewall;
a mounting table including a lower electrode, the mounting table provided in the processing chamber such that a first space is defined between the mounting table and the sidewall;
an upper electrode arranged to face the lower electrode in a first direction such that a second space is defined between the upper electrode and the lower electrode;
a high frequency power supply configured to apply a high frequency power for plasma generation to the upper electrode;
a gas supply system for supplying a processing gas into the processing chamber; and
a grounding unit connected to a ground potential, the grounding unit being configured to move independently from the upper electrode in the first direction in a third space which extends to the first space in the first direction and also to the second space in a second direction perpendicular to the first direction,
wherein the ground unit is configured to move in the third space while the second space and the third space remain interconnected so as to control a density of plasma generated in the third space, and
wherein the third space is formed above an outside of an outer periphery of the mounting table.

2. The plasma processing apparatus of claim 1, wherein the grounding unit is configured to move along the first direction by a distance of about 0 mm to 20 mm from a reference position corresponding to a position of a surface of the upper electrode that contacts with the second space in the first direction.

3. The plasma processing apparatus of claim 2, wherein a distance between the upper electrode and the lower electrode is greater than or substantially equal to 20 mm and smaller than or substantially equal to 150 mm.

4. The plasma processing apparatus of claim 1, wherein a distance between the upper electrode and the lower electrode is greater than or substantially equal to 20 mm and smaller than or substantially equal to 150 mm.

5. A method for processing an object by using a plasma processing apparatus including a processing chamber that includes a sidewall, the method comprising:
- mounting an object on a mounting table that includes a lower electrode, the mounting table provided in the processing chamber such that a first space is defined between the mounting table and the sidewall;
- moving a grounding unit independently from an upper electrode along a first direction in a third space which extends to the first space in the first direction and also to a second space in a second direction perpendicular to the first direction, the upper electrode arranged to face the lower electrode in the first direction such that the second space is defined between the upper electrode and the lower electrode, the grounding unit connected to a ground potential;
- supplying a high frequency power supply configured to apply a high frequency power for plasma generation to the upper electrode; and
- supplying, through a gas supply system, a processing gas into the processing chamber and generating plasma of the processing gas in the processing chamber,
- wherein the ground unit is configured to move in the third space while the second space and the third space remain interconnected so as to control a density of the plasma generated in the third space, and
- wherein the third space is formed above an outside of an outer periphery of the mounting table.

6. The method of claim 5, wherein the grounding unit is configured to move along the first direction by a distance of about 0 mm to 20 mm from a reference position corresponding to a position of a surface of the upper electrode that contacts with the second space in the first direction.

7. The method of claim 6, wherein a distance between the upper electrode and the lower electrode is greater than or substantially equal to 20 mm and smaller than or substantially equal to 150 mm.

8. The method of claim 5, wherein a distance between the upper electrode and the lower electrode is greater than or substantially equal to 20 mm and smaller than or substantially equal to 150 mm.

* * * * *